(12) United States Patent
Pogge

(10) Patent No.: US 7,049,695 B1
(45) Date of Patent: May 23, 2006

(54) METHOD AND DEVICE FOR HEAT DISSIPATION IN SEMICONDUCTOR MODULES

(75) Inventor: H. Bernhard Pogge, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,643

(22) Filed: Jan. 14, 2005

(51) Int. Cl.
*H01L 23/12* (2006.01)
*H01L 23/10* (2006.01)
*H05K 7/20* (2006.01)

(52) U.S. Cl. ...................... 257/700; 257/701; 257/702; 257/703; 257/705; 257/706; 257/707; 257/708; 257/709; 257/712; 257/713; 257/717; 257/720; 438/122; 438/502; 361/688; 361/701; 361/702; 361/703

(58) Field of Classification Search ........ 257/700–703, 257/705–709, 712, 713, 717, 720
See application file for complete search history.

(56) References Cited

U.S. PATENT DOCUMENTS

| 6,110,806 A | 8/2000 | Pogge |
| 6,444,560 B1 | 9/2002 | Pogge et al. |
| 6,477,054 B1 * | 11/2002 | Hagerup ..................... 361/720 |
| 6,599,778 B1 | 7/2003 | Pogge et al. |
| 2004/0238946 A1 * | 12/2004 | Tachibana et al. .......... 257/706 |

FOREIGN PATENT DOCUMENTS

| JP | 5-82686 | * 4/1993 | ................. 257/706 |
| JP | 5-343556 | * 12/1993 | ................. 257/700 |

* cited by examiner

*Primary Examiner*—Jasmine Clark
(74) *Attorney, Agent, or Firm*—Ira D. Blecker

(57) ABSTRACT

A structure and method are provided for dissipating heat from a semiconductor device chip. A first layer of a dielectric material (e.g. polyimide) is formed on a front side of a heat spreader (typically Si). A plurality of openings are formed through this first layer; the openings are filled with metal (typically Cu), thereby forming metal studs extending through the first layer. A second layer of metal is formed on the backside of the device chip. The first layer and the second layer are then bonded in a bonding process, thereby forming a bonding layer where the metal studs contact the second layer. The bonding layer thus provides a thermal conducting path from the chip to the heat spreader.

26 Claims, 7 Drawing Sheets

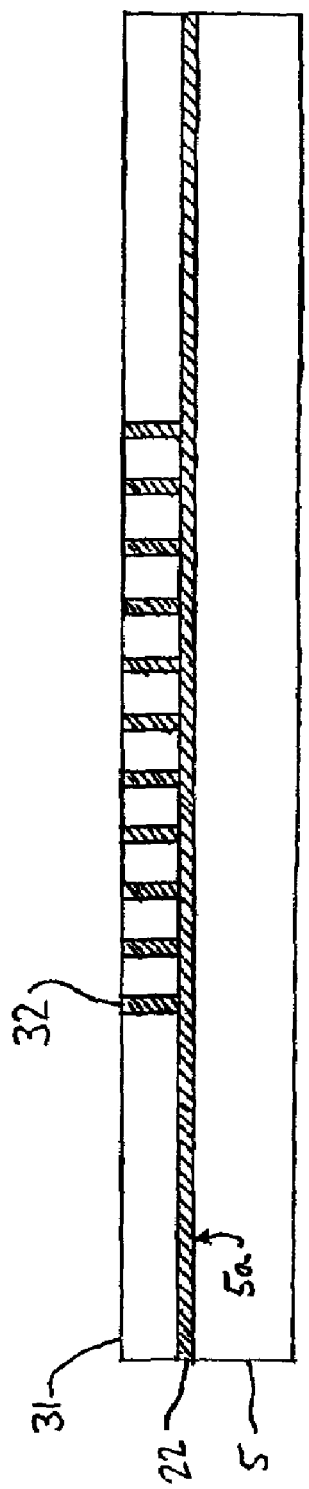
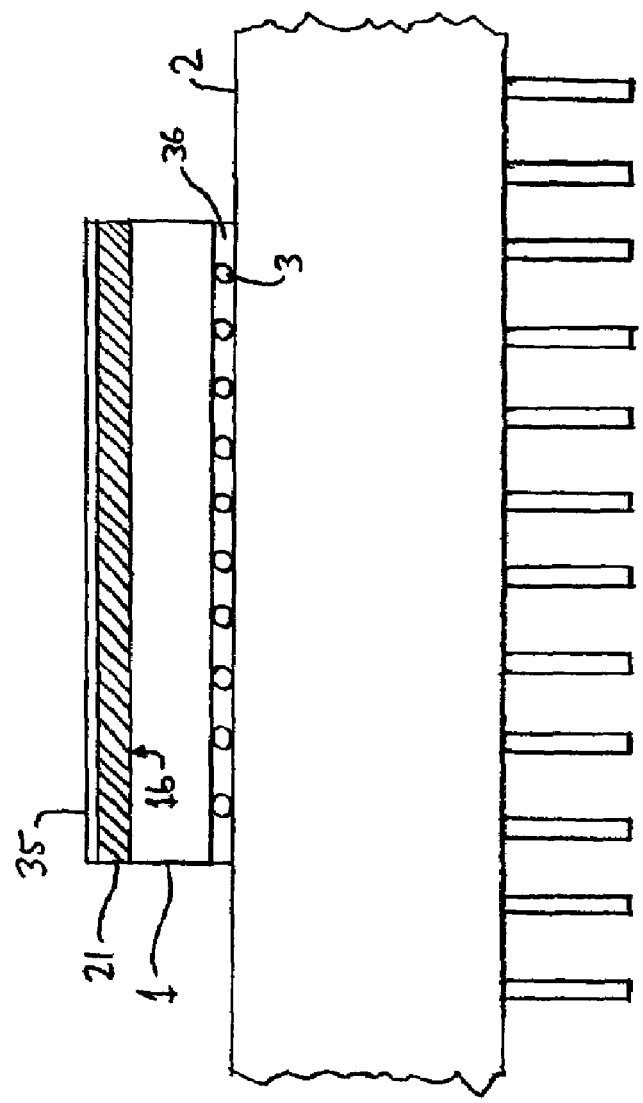
FIG. 3A
FIG. 3B

METHOD AND DEVICE FOR HEAT DISSIPATION IN SEMICONDUCTOR MODULES

FIELD OF THE INVENTION

This invention relates to semiconductor device manufacturing, and in particular to methods and structures for promoting heat dissipation in high-performance semiconductor devices. More particularly, the invention relates to attachment of heat-spreading chips to device chips with improved thermal conductance.

BACKGROUND OF THE INVENTION

Semiconductor devices are continuously increasing in performance, and at the same time are generating increasing amounts of excess heat during operation. As individual devices are continually reduced in size, with more heat generated in a shrinking area, the problem of heat dissipation has become a critical factor affecting device performance.

In order to effectively cool a device chip, a heat spreader chip is typically attached to the backside of the device chip. FIG. 1 shows a conventional arrangement of a semiconductor module, where a device chip 1 (having the actual devices fabricated in region 1a near its front surface) is turned face down and electrically connected to a substrate 2; a number of C4 connectors 3 (controlled-collapse chip connectors) form the interconnects between the devices and the substrate. A layer 4 of heat-conducting material is applied to the backside 1b of device chip 1; this layer serves to attach heat spreader chip 5 to the device chip. A shown in FIG. 1, heat spreader chip 5 is typically larger than device chip 1. A conventional material for heat spreader chip 5 is SiC.

A conventional material used in layer 4 to attach the heat spreader to the chip is thermal paste. The thermal paste layer is typically 50–100 μm thick. The thermal conductance of thermal paste is at best 0.05 W/cm° C., which does not allow for efficient heat transfer from the chip to the heat spreader. Solder has been used as an alternative material for layer 4; solder has better thermal conductance than thermal paste (about 0.2 W/cm° C.), but has physical properties that make it unattractive for this purpose in device processing. There is a need for a method and structure for attaching a heat spreader chip to a device chip, in which the attachment layer 4 has significantly higher thermal conductance than thermal paste. In addition, it is desirable that fabrication of such an attachment layer, and bonding of the heat spreader and device chip, be easily integrated into conventional device manufacturing processes.

SUMMARY OF THE INVENTION

The present invention addresses the above-described need by providing a process for attaching a heat spreader to a device chip using attachment layer(s) including planar copper films and/or films including copper studs. In accordance with the present invention, this is done by coating the chip 1 and the heat spreader 5 with Cu layers and bonding the layers together. An additional layer of polyimide, with Cu studs formed therein, is preferably added between those Cu layers.

According to a first aspect of the invention, a method is provided for dissipating heat from a semiconductor device chip. A first layer of a first metal (typically Cu) is formed on the backside of the chip; a second layer of this metal is formed on a front side of a heat spreader (typically Si or SiC). A third layer of a different metal (typically Sn) is formed on the first layer and/or the second layer. The first layer, second layer and third layer are then bonded in a bonding process with the third layer between the first layer and the second layer, thereby forming a bonding layer including an alloy of the first metal and the second metal. The bonding layer thus provides a thermal conducting path from the chip to the heat spreader with a thermal conductance of at least 1.0 W/cm° C. and up to 4 W/cm° C. The alloy is typically a Cu-Sn eutectic alloy, formed at a temperature not greater than about 400° C.

According to a second aspect of the invention, another method is provided for dissipating heat from a semiconductor device chip. A first layer of a dielectric material (e.g. polyimide) is formed on a front side of a heat spreader (typically Si or SiC). A plurality of openings are formed through this first layer; the openings are filled with metal (typically Cu), thereby forming metal studs extending through the first layer. A second layer of metal is formed on the backside of the device chip. The first layer and the second layer are then bonded in a bonding process, thereby forming a bonding layer where the metal studs contact the second layer. The bonding layer thus provides a thermal conducting path from the chip to the heat spreader. Another layer of metal may be formed on the front side of the heat spreader, so that the studs extend between the metal layers. Alternatively, this method may be practiced with the first layer formed on the backside of the device chip, while the second layer is formed on the heat spreader.

The studs may be arranged in accordance with a heat generation characteristic of the device chip. In particular, the studs may be arranged so that a relatively greater areal density of studs, or larger studs, are disposed in the first layer corresponding to an area of the device chip in which heat is generated at a relatively greater rate (a hot spot of the chip).

According to a third aspect of the invention, a structure is provided for dissipating heat generated in a semiconductor device chip. The structure includes a heat spreader and a first layer of a dielectric material disposed on a front side thereof. The first layer (typically polyimide) has a plurality of openings extending therethrough; a plurality of metal studs fill the openings and extend through the first layer. A second layer of metal (typically Cu) is disposed on the backside of the device chip. The first layer and the second layer are bonded together in a bonding layer, in which the metal studs contact the second layer. The bonding layer thus provides a thermal conducting path from the chip to the heat spreader.

BRIEF DESCRIPTION OF THE DRAWINGS

FIG. 3A illustrates a heat spreader with a polyimide film including Cu studs formed thereon, in accordance with a second embodiment of the invention.

FIG. 3B illustrates a device chip in a module, where the device chip is prepared for bonding to the heat spreader of FIG. 3A.

DETAILED DESCRIPTION OF PREFERRED EMBODIMENTS OF THE INVENTION

The process of the present invention employs a methodology sometimes referred to as transfer-and-join (T&J), which in these embodiments may be practiced using standard techniques, such as lithography and metal deposition, used in back-end-of-the-line (BEOL) device processing. The heat spreader chip is preferably Si (or SiC with appropriate properties), to minimize differences in the thermal coefficient of expansion between the heat spreader chip and the device chip. The opposing surfaces of the device chip and the heat spreader chip are prepared with bonding layers in separate processes; the chips are then attached in a bonding process at a relatively low temperature (up to about 400° C.). The resulting attachment layer between the device chip and heat spreader chip is thinner and has higher thermal conductance than a conventional thermal paste layer. The bonding layers may be planar Cu films and/or polyimide with Cu studs, as detailed below.

FIRST EMBODIMENT: CU FILM BONDING

Figure 1:
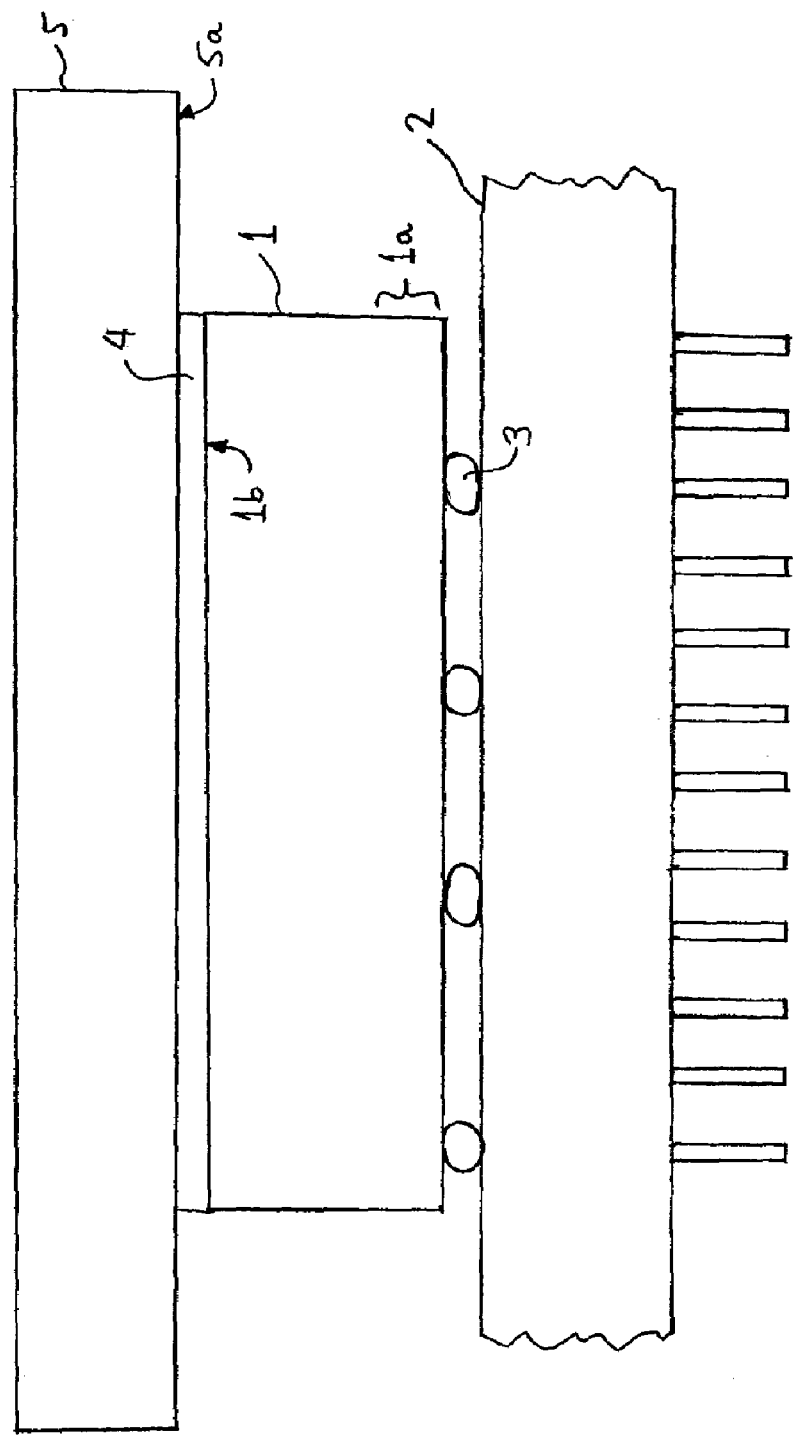
FIG. 1 schematically illustrates a conventional semiconductor device module including a heat spreader attached to a device chip using thermal paste.
Figure 2A:
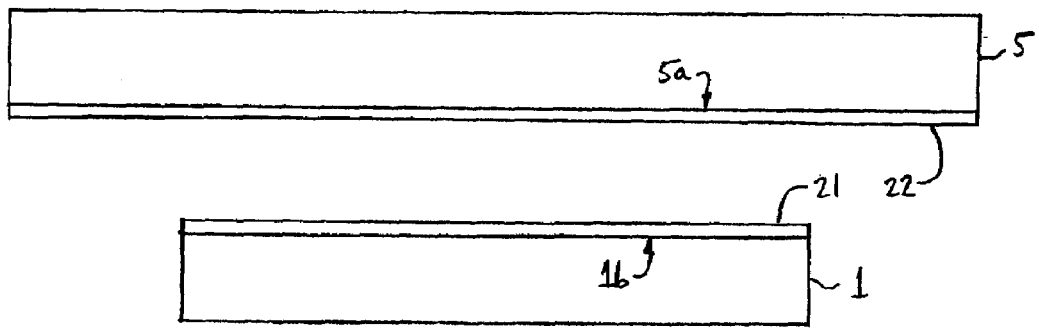
FIGS. 2A and 2B illustrate a process for attaching a heat spreader to a device chip by bonding of blanket metal layers, in accordance with a first embodiment of the invention.
Figure 2B:
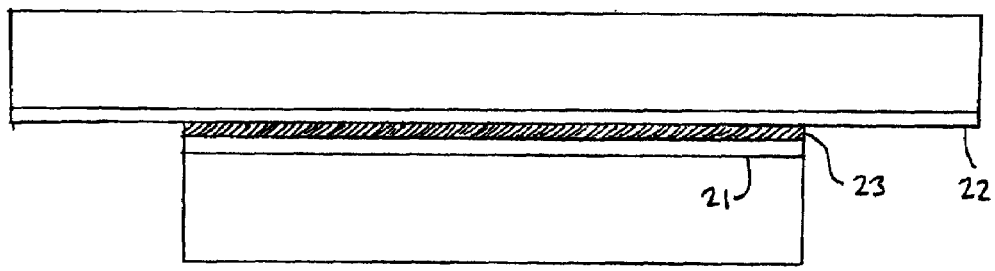

In this embodiment of the invention, the backside surface 1b of the device chip 1 and the front surface 5a of the heat spreader chip 5 are each coated with a blanket planar film of copper 21, 22 (see FIG. 2A). Since the thermal dissipation efficiency depends inversely on the thickness of the bonding layers, Cu layers 21, 22 should each have a minimum thickness that provides reliable bonding. This thickness has been found to be approximately 1.0 µm. The opposing Cu surfaces are then brought into contact and bonded at a temperature less than about 400° C. The Cu-to-Cu bonding of layers 21 and 22 may be facilitated by depositing another metal layer 23 over one of the Cu layers, so that in the bonding process layer 23 is between the Cu layers. In FIG. 2B, metal layer 23 is shown as having been deposited over layer 21 on the device chip. A preferred metal for layer 23 is Sn. Placing metal layer 23 between the Cu layers permits formation of a eutectic alloy (e.g. Cu-Sn), which effectively converts layers 21, 23, and the contacting area of layer 22 into a single bonding layer. Some details of alloy formation in film bonding are discussed in U.S. Pat. No. 6,110,806 (Pogge), assigned to the same assignee as the present invention, the disclosure of which is hereby incorporated by reference. It is estimated that the thermal conductance of this bonding layer (Cu/Sn alloy) is near 4 W/cm° C., a factor of at least 50 greater than that of thermal paste.

The use of blanket films for bonding the device chip and heat spreader chip avoids the need for lithography processes; accordingly, this method may be practiced at relatively low cost. However, it will be apparent to those skilled in the art that in the bonding of the blanket metal films, some voids may be formed between the films as they are brought together. This will decrease the effectiveness of the metal-to-metal bond. This problem may be avoided by using a bonding layer of patterned Cu studs, as detailed below.

SECOND EMBODIMENT: PATTERNED COPPER STUDS

In this embodiment, a polyimide film 31 is formed over the front surface 5a of the heat spreader chip 5. It is preferable, but not required, that surface 5a be first coated with a blanket Cu layer 22, with polyimide layer 31 formed thereon (FIG. 3A). Polyimide layer 31 is patterned using standard lithography techniques, and then etched to form vias through layer 31, exposing the underlying material at the bottom of each via (in FIG. 3A, the Cu of layer 22). The vias are then filled in a metal deposition process to form studs 32 of copper extending through the polyimide layer. Polyimide layer 32 is typically about 5 µm thick or less. The pattern of studs on the heat spreader chip is such that the studs are in an array having an area approximately matching that of the device chip.

Figure 4:
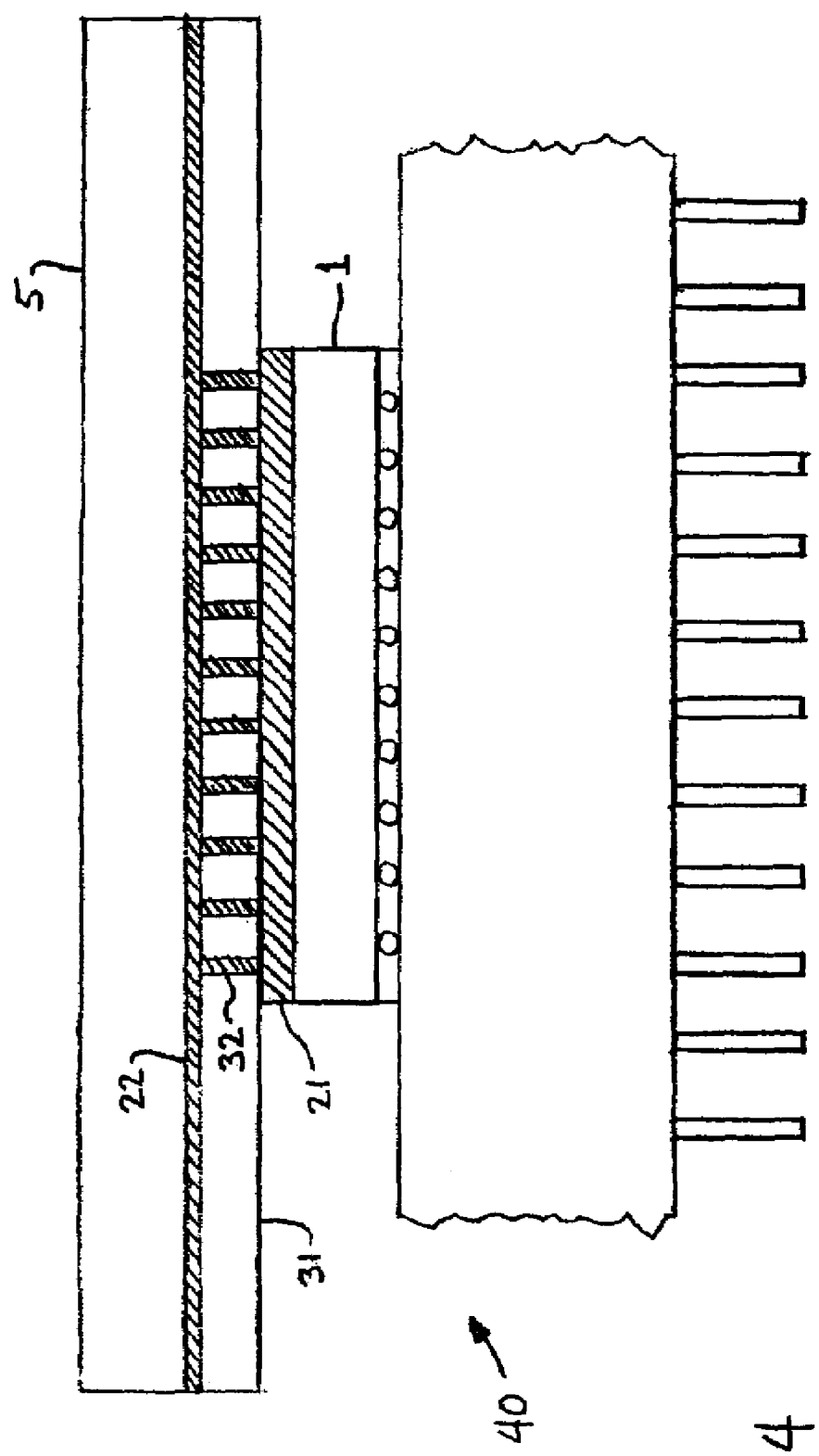
FIG. 4 illustrates bonding of the heat spreader of FIG. 3A and the device chip of FIG. 3B to form a semiconductor module, in accordance with the second embodiment of the invention.

The device chip is prepared with a blanket Cu layer 21 formed on the backside 1b; until the chip is ready for bonding, the Cu layer is protected by a temporary insulating film 35 (FIG. 3B). In FIG. 3B, device chip 1 is shown as already attached to substrate 2 by a C4 process, including forming C4 connectors 3 and underfill 38. (It is possible, of course, to bond the device chip and heat spreader chip together before bonding to the substrate. This will be preferable if there is a risk that the C4 connectors may collapse during the bonding process.) FIG. 4 shows the result of the bonding process, in which heat spreader chip 5 is bonded to device chip 1 to form a completed module 40. As shown in FIG. 4, the top surface of polyimide layer 31 opposes the top surface of Cu layer 21 on chip 1 (protective film 35 having been removed prior to the bonding process). In the bonding process, polyimide layer 31 adheres to Cu layer 21, and Cu studs 32 make contact therewith. Accordingly, multiple thermal pathways of Cu lead from device chip 1 to heat spreader chip 5. Some details of formation of metal studs in polyimide vias and bonding of polyimide to metal layers are discussed in U.S. Pat. No. 6,444,560 (Pogge et al.), assigned to the same assignee as the present invention, the disclosure of which is hereby incorporated by reference. The overall thickness of the bonding layer (which in this embodiment includes layers 21, 31 and 22) is typically in the range of 6–8 µm.

It will be appreciated that the method described just above may be practiced with the device chip and the heat spreader chip reversed; that is, the polyimide film with the Cu studs may be formed instead on the backside of the device chip (preferably on a blanket Cu layer), while the heat spreader chip is prepared with a blanket Cu layer covered by an insulator prior to the bonding process.

Figure 5A:
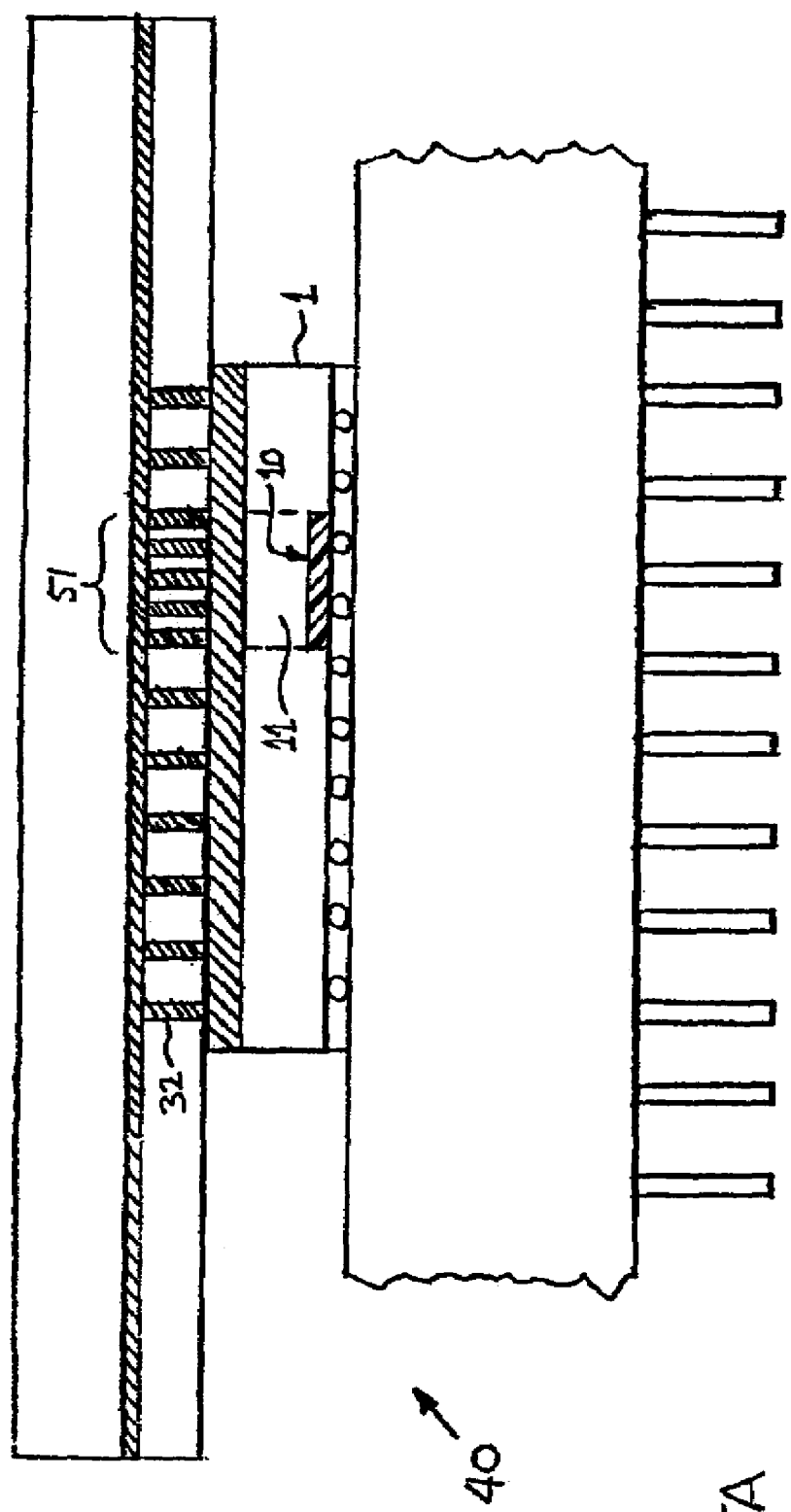
FIGS. 5A and 5B illustrate alternative structures and methods for dissipating heat from a localized area of the device chip, in accordance with the invention.
Figure 5B:
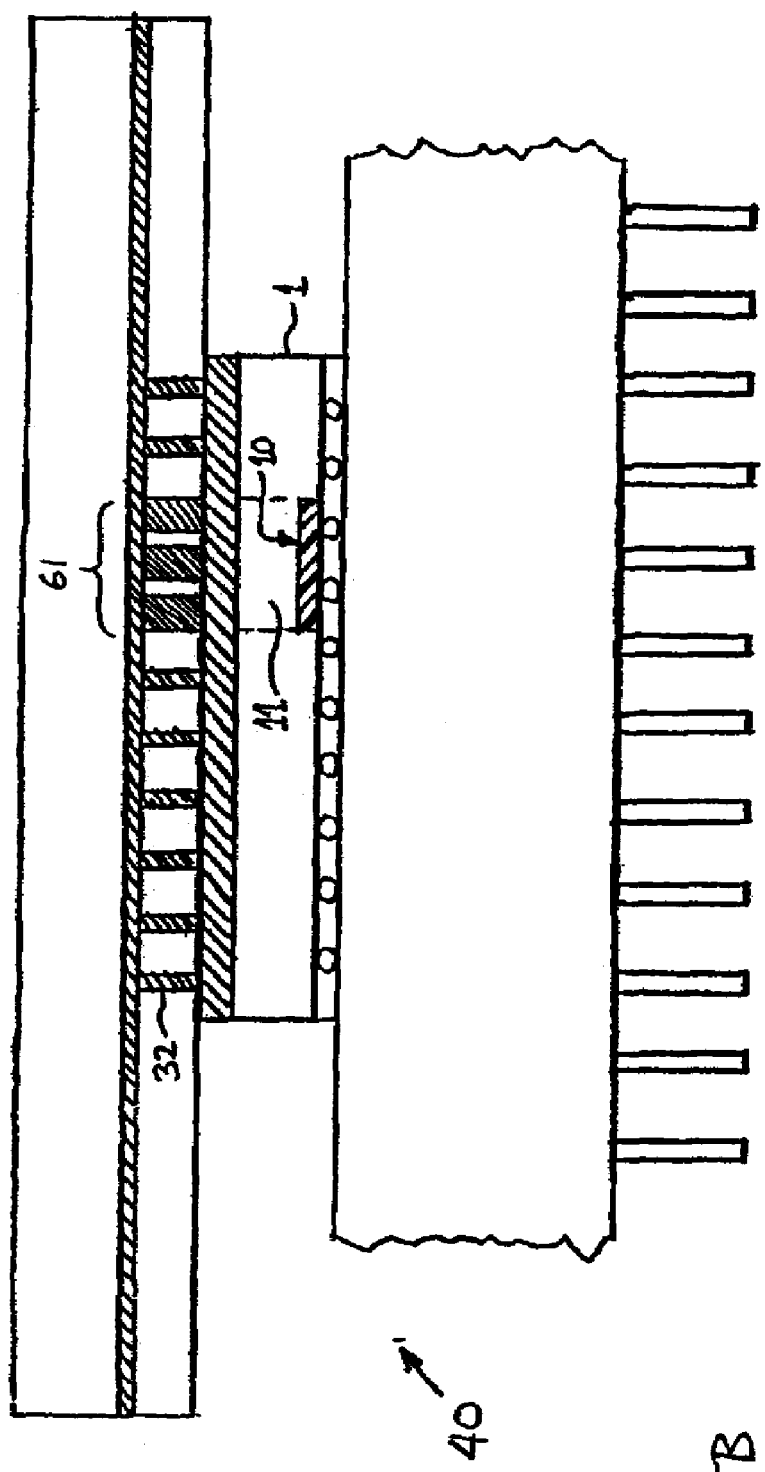

It is noteworthy that the pattern or the size of the Cu studs 32 need not be uniform, but may be tailored to the heat generation characteristics of the device chip 1. For example, as shown in FIG. 5A, a region 10 in the active device area of chip 1 may be populated with devices that generate heat at a particularly excessive rate, causing a hot spot 11 on the chip. The Cu studs 51 over the hot spot may then be arranged in a higher-density pattern (that is, arranged with relatively greater areal density) to provide greater heat dissipation over the hot spot, as shown in FIG. 5A. Alternatively, as shown in FIG. 5B, the openings in the polyimide layer may be made larger over the hot spot (with no change in the number or arrangement of the openings), so that the studs 61 conducting heat from the hot spot are larger (that is, have a greater lateral dimension) than studs on other portions of the device chip. It will be appreciated that in either approach, the use of heat-conducting studs provides the ability to focus heat dissipation on particular areas of the device chip.

Figure 6:
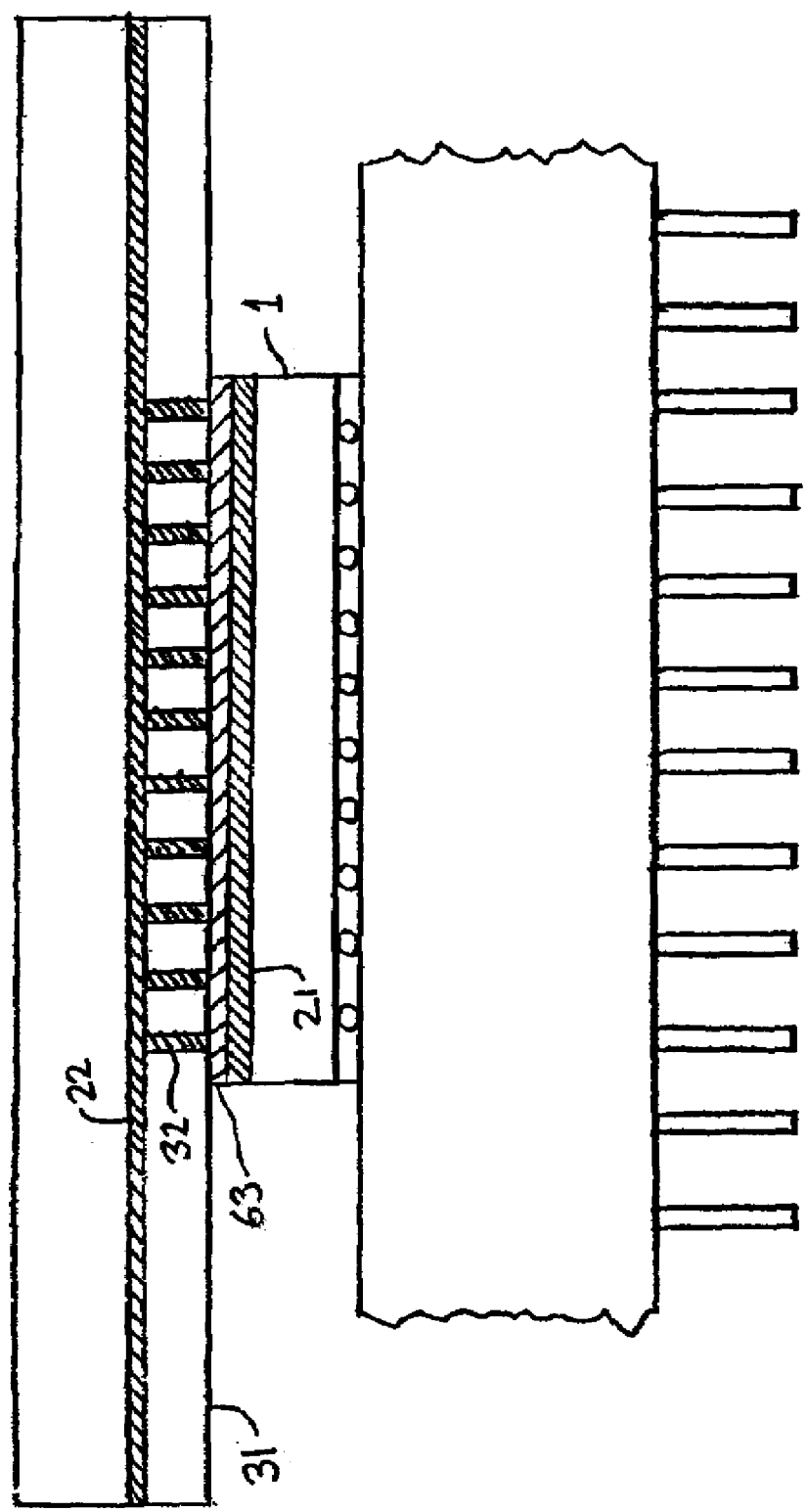
FIG. 6 illustrates an alternative process for attaching the heat spreader of FIG. 3A to the device chip to form a semiconductor module, in accordance with the invention.

The bonding of the Cu studs 32 to the Cu layer 21 on the backside of device chip 1 may be enhanced by forming a metal alloy, as in the first embodiment. FIG. 6 shows an arrangement of bonding layers in which a metal layer 63 (e.g. Sn) is deposited over layer 21 prior to the bonding process. An alloy is thus formed from the Cu in layer 21 and studs 32 and the metal of layer 63. The overall thickness of the bonding layer (including layers 21, 63, 31 and 22) is not greater than 8 µm.

The present invention (wherein a Si heat spreader chip is bonded to the device chip using Cu layers and studs) offers significant advantages in thermal dissipation compared with the conventional approach (wherein a SiC heat spreader is bonded to the device chip by a layer of thermal paste). The thermal conductance of Cu is 4 W/cm° C., which is a factor of about 100 times that of thermal paste. The thickness of the bonding layer in the present invention is typically in the range of 6–8 µm; this is thinner than a typical thermal paste layer by a factor of about 10. In addition, it is estimated that the Si heat spreader of the present invention is less costly than a conventional SiC heat spreader by a factor of 10. Furthermore, it should be noted that the Si heat spreader chip of the present invention offers an advantage over most conventional SiC heat spreaders by minimizing the difference in the thermal coefficient of expansion between the device chip and the heat spreader.

It is also noteworthy that the heat spreader/device chip bonding of the present invention is compatible with typically used cooling liquids. Accordingly, the heat dissipation approach of the present invention is applicable to both air-cooled and liquid-cooled chip/module systems.

While the present invention has been described in conjunction with specific preferred embodiments, it would be apparent to those skilled in the art that many alternatives, modifications and variations can be made without departing from the scope and spirit of the invention. Accordingly, the invention is intended to encompass all such alternatives, modifications and variations which fall within the scope and spirit of the invention and the following claims.

What is claimed is:

1. A method for providing heat dissipation for a semiconductor device chip, the device chip having a front side adjacent to which heat-generating devices are formed and having a backside, the method comprising the steps of:
   providing a heat spreader;
   forming a first layer of a first metal on the backside of the chip;
   forming a second layer of said first metal on a front side of the heat spreader;
   forming a third layer of a second metal, different from the first metal, on at least one of the first layer and the second layer; and
   bonding the first layer, second layer and third layer in a bonding process wherein the third layer is between the first layer and the second layer, thereby forming a bonding layer including an alloy of the first metal and the second metal, the bonding layer providing a thermal conducting path from the chip to the heat spreader with a thermal conductance in a range of about 1.0 W/cm° C. to about 4 W/cm° C.

2. A method according to claim 1, wherein the first metal is copper, the second metal is tin, and said bonding step is performed at a temperature not greater than about 400° C. to form a eutectic alloy of copper and tin.

3. A method according to claim 1, wherein the heat spreader is one of silicon and silicon carbide (SiC).

4. A method for providing heat dissipation for a semiconductor device chip, the device chip having a front side adjacent to which heat-generating devices are formed and having a backside, the method comprising the steps of:
   providing a heat spreader;
   forming a first layer of a dielectric material on one of (i) a front side of the heat spreader and (ii) the backside of the device chip;
   forming a plurality of openings through the first layer;
   filling the openings with metal, thereby forming metal studs extending through the first layer;
   forming a second layer of metal on the one of (i) the front side of the heat spreader and (ii) the backside of the device chip on which the first layer is not formed;
   bonding the first layer and the second layer in a bonding process performed at a temperature not greater than about 400° C., thereby forming a bonding layer wherein the metal studs contact the second layer, the bonding layer providing a thermal conducting path from the chip to the heat spreader.

5. A method according to claim 4, wherein the dielectric material is polyimide and the metal is copper.

6. A method according to claim 4, wherein the heat spreader is one of silicon and silicon carbide (SiC).

7. A method according to claim 4, wherein the studs are arranged in an array having an area in accordance with an area of the backside of the device chip.

8. A method according to claim 4, wherein the first layer is formed on the front side of the heat spreader and the second layer is formed on the backside of the device chip.

9. A method according to claim 4, wherein the first layer is formed on the backside of the device chip and the second layer is formed on the front side of the heat spreader.

10. A method according to claim 4, further comprising the step, before forming the first layer, of forming a third layer of metal in contact with the front side of the heat spreader, so that the first layer is subsequently formed on the third layer, the metal studs contact the second layer and the third layer, and the bonding layer includes the first layer, the second layer and the third layer.

11. A method according to claim 10, wherein the metal is copper, and the bonding layer provides a thermal conducting path from the chip to the heat spreader with a thermal conductance of about 4 W/cm° C.

12. A method according to claim 4, wherein the metal is characterized as a first metal, and further comprising the step, before said bonding step, of forming on the second layer a third layer of a second metal different from the first metal, so that during said bonding step the third layer is between the first layer and the second layer, and wherein said bonding step comprises bonding the first layer, the second layer and the third layer to form a bonding layer including an alloy of the first metal and the second metal.

13. A method according to claim 12, wherein the first metal is copper, the second metal is tin, and said bonding step is performed at a temperature not greater than about 400° C. to form a eutectic alloy of copper and tin.

14. A method according to claim 4, wherein the studs are disposed in accordance with a heat generation characteristic of the device chip.

15. A method according to claim 4, wherein the studs are arranged so that a relatively greater areal density of studs is disposed in an area of the first layer corresponding to an area of the device chip in which heat is generated at a relatively greater rate.

16. A method according to claim 4, wherein the studs are disposed in the first layer so that studs having a relatively greater lateral dimension are in an area of the first layer corresponding to an area of the device chip in which heat is generated at a relatively greater rate.

17. A structure for dissipating heat generated in a semiconductor device, the device chip having a front side adjacent to which heat-generating devices are formed and having a backside, the structure comprising:
 a heat spreader;
 a first layer of a dielectric material disposed on a front side of the heat spreader, said first layer having a plurality of openings extending therethrough;
 a plurality of metal studs of a first metal filling the openings and extending through the first layer;
 a second layer of metal disposed on the backside of the device chip; and
 a third layer of metal in contact with the front side of the heat spreader so that the first layer is disposed on the third laye,r the first layer, the second layer and the third layer being bonded together in a bonding layer in which the metal studs contact the second layer and the third layer, the bonding layer providing a thermal conducting path from the chip to the heat spreader.

18. A structure according to claim 17, wherein the dielectric material is polyimide and the metal is copper.

19. A structure according to claim 17, wherein the heat spreader is one of silicon and silicon carbide (SiC).

20. A structure according to claim 17, wherein the studs are arranged in an array having an area in accordance with an area of the backside of the device chip.

21. A structure according to claim 17, wherein the metal is copper, and the bonding layer provides a thermal conducting path from the chip to the heat spreader with a thermal conductance of about 4 W/cm° C.

22. A structure according to claim 17, wherein the metal is characterized as a first metal, and further comprising a third layer of a second metal different from the first metal, said third layer disposed between the first layer and the second layer, so that the first layer, the second layer and the third layer are bonded together to form the bonding layer, the bonding layer including an alloy of the first metal and the second metal.

23. A structure according to claim 22, wherein the first metal is copper, the second metal is tin, and said bonding layer includes a eutectic alloy of copper and tin.

24. A structure according to claim 17, wherein the studs are arranged in accordance with a heat generation characteristic of the device chip.

25. A structure according to claim 17, wherein the studs are arranged so that a relatively greater areal density of studs is disposed in the first layer corresponding to an area of the device chip in which heat is generated at a relatively greater rate.

26. A structure according to claim 17, wherein the studs are disposed in the first layer so that studs having a relatively greater lateral dimension are in an area of the first layer corresponding; to an area of the device chip in which heat is generated at a relatively greater rate.

* * * * *